(12) United States Patent
Weitekamp et al.

(10) Patent No.: US 9,395,428 B2
(45) Date of Patent: Jul. 19, 2016

(54) PARTIAL/FRACTIONAL POLARIZATION TRANSFER FOR SINGLE-SCAN MAGNETIC RESONANCE SPECTROSCOPY AND IMAGING

(75) Inventors: Daniel P. Weitekamp, Altadena, CA (US); Valerie A. Norton, Santa Barbara, CA (US)

(73) Assignee: California Institute of Technology, Pasadena, CA (US)

( * ) Notice: Subject to any disclaimer, the term of this patent is extended or adjusted under 35 U.S.C. 154(b) by 1099 days.

(21) Appl. No.: 13/442,577

(22) Filed: Apr. 9, 2012

(65) Prior Publication Data

US 2012/0326717 A1 Dec. 27, 2012

Related U.S. Application Data

(60) Provisional application No. 61/473,605, filed on Apr. 8, 2011.

(51) Int. Cl.
*G01R 33/46* (2006.01)
*G01R 33/56* (2006.01)

(52) U.S. Cl.
CPC ........ *G01R 33/4608* (2013.01); *G01R 33/5601* (2013.01); *G01R 33/5605* (2013.01)

(58) Field of Classification Search
USPC ......... 324/300–322; 600/407–435; 424/9.361
See application file for complete search history.

(56) References Cited

U.S. PATENT DOCUMENTS

| 5,926,023 A * | 7/1999 | De Groot ........... G01R 33/4641 324/300 |
| 2011/0274626 A1* | 11/2011 | Duckett et al. ............. 424/9.361 |
| 2012/0326717 A1* | 12/2012 | Weitekamp et al. .......... 324/301 |
| 2014/0002077 A1* | 1/2014 | Deshpande ............ G01R 33/56 324/309 |
| 2014/0112870 A1* | 4/2014 | Waddell ............. G01R 33/4608 424/9.3 |
| 2016/0041241 A1* | 2/2016 | Devience ......... G01R 33/34092 324/309 |

\* cited by examiner

*Primary Examiner* — Melissa Koval
*Assistant Examiner* — Tiffany Fetzner
(74) *Attorney, Agent, or Firm* — Kilpatrick Townsend & Stockton LLP

(57) ABSTRACT

A method of measuring precessing magnetization includes providing a first site characterized by a first spin order and providing a second site. The method also includes transferring a portion of the first spin order from the first site to the second site. The second site is characterized by a second spin order orthogonal to the first spin order. The method further includes exposing a sample including the first site and the second site to a magnetic field, measuring a precessing magnetization of at least one of the first site or the second site, repeating the transferring a portion of the first spin order from the first site to the second site, and repeating the measuring of the precessing magnetization.

26 Claims, 9 Drawing Sheets

PARTIAL/FRACTIONAL POLARIZATION TRANSFER FOR SINGLE-SCAN MAGNETIC RESONANCE SPECTROSCOPY AND IMAGING

CROSS-REFERENCES TO RELATED APPLICATIONS

This application claims priority to U.S. Provisional Patent Application No. 61/473,605, filed on Apr. 8, 2011, the disclosure of which is hereby incorporated by reference in its entirety. Partial polarization transfer for single-scan spectroscopy and imaging, J. Chem. Phys. 135, 141107 (2011) is also hereby incorporated by reference in its entirety for all purposes

STATEMENT AS TO RIGHTS TO INVENTIONS MADE UNDER FEDERALLY SPONSORED RESEARCH OR DEVELOPMENT

Not Applicable

BACKGROUND OF THE INVENTION

NMR (nuclear magnetic resonance) and MRI (magnetic resonance imaging) are useful systems that have been developed and provide information for chemically specific kinetics and imaging, but are typically limited by poor signal-to-noise. Recently, methods have been developed for generating liquid samples of molecules with spin polarization of order $10^{-1}$, known as hyperpolarization, at sites with spin-lattice relaxation times of tens of seconds, and enhancement of $10^4$-$10^5$ over ambient temperature experiments on samples initially at equilibrium in typical high magnetic fields[1-5].

In addition to the degree of spin ordering, another important property is the lifetime over which the order persists when out of equilibrium. For N spins ½ there are at least $2^N$-1 quasiconstants under the effective spin Hamiltonian. Of particular value are those types of spin order with the longest lifetimes, allowing observations over longer periods of time. These include the longitudinal spin polarization, proportional to the expectation value of the z component $I_{zi}$ of the angular momentum of the $i^{th}$ spin, whose lifetime against equilibration is the spin-lattice relaxation time $T_{1i}$. In certain cases the relative ordering of spins, such as the two-spin scalar order $I_i \cdot I_j$ can be created and can have an even longer lifetime $T_S$. As a resource for hyperpolarized NMR, scalar order was introduced as symmetrization order in techniques known as PASADENA [6-7] and ALTADENA [8], in which molecular addition of parahydrogen prepares a molecule with a pair of protons in the singlet spin state, which is convertible to observable polarization either on these two protons or on other spins coupled to them within a molecule or transient complex.

Transfer of scalar order was demonstrated to polarize $^{13}$C [9] using a pulse sequence derived from INEPT[10]. Additional methods for this transfer from scalar order to polarization on a resolved third spin are known[6, 11-15]. In this context, transfer of order to the heteronucleus followed by its observation as polarization may increase the time during which hyperpolarization is available, allow better chemical discrimination, and increase the contrast against the background signals from other weakly polarized molecules.

After reaction of a precursor molecule with parahydrogen, the singlet state is typically no longer an eigenstate of the new system, due to the location of the nascent protons in magnetically inequivalent sites. The subsequent oscillatory spin evolution upon molecular addition is typically averaged over the distribution of times at which molecular addition occurs, thereby irreversibly reducing the spin order. The scalar order may be preserved by application of decoupling to the hydrogen, such as a train of π pulses[2, 13-14, 16]. The role of such scalar locking sequences in mitigating other relaxation mechanisms has been elucidated and applications made in which the scalar order is initially created by conversion from equilibrium or nonequilibrium polarization[17-19] rather than by molecular addition of a molecule with scalar order.

Hyperpolarized signals are typically generated on sites that are insensitive spin ½ heteronuclei such as $^{13}$C or $^{15}$N, which are preferred for their longer relaxation times and often superior chemical specificity in comparison to $^1$H (e.g., protons on the order of 1 second and carbon and nitrogen on the order of 1 minute). Longer relaxation time allows time to transfer the highly polarized molecules from the polarizer to the system of interest and to allow time for chemical dynamics with minimum polarization loss. Nuclei with lower gyromagnetic ratios tend to have longer spin-lattice relaxation times, so the most desirable targets from the point of view of long spin lifetimes are also the least desirable from the point of view of sensitivity. The gyromagnetic ratio enters linearly in both the magnitude of the detected magnetic moment and through the proportionality of inductive signals to Larmor frequency, offsetting the gains from hyperpolarization in comparison to detection on more sensitive nuclei.

Transferring the polarization[10, 20-21] from less sensitive to more sensitive spins in combination with hyperpolarization has been proposed to recover this lost sensitivity[22-25] and, for the purposes of MRI, additionally allows obtaining a given spatial resolution with practical pulsed field gradient power. When N equivalent protons I couple to the heteronucleus S, this transfer is efficiently produced by the refocused INEPT (insensitive nucleus enhanced by polarization transfer) sequence[10, 20-21] in the "reverse" direction. This strategy has previously been extended to hyperpolarized samples[22-23, 25] in which the pulse sequence was designed to optimally polarize the target protons at the expense of fully depleting the heteronuclear hyperpolarization in the interrogated ensemble of molecules. In the special case of a system with uniform chemical composition (e.g. a solution in a NMR tube), a longer time course may be generated by spatially selecting different voxels for probing a reaction with complete S to I transfer at different times.[25]

Despite the progress made in NMR and MRI techniques, there is a need in the art for improved methods and systems to maximize the information content obtained during the application of NMR and MRI techniques.

SUMMARY OF THE INVENTION

The present invention relates generally to nuclear magnetic resonance, widely used in chemical analysis and medical imaging systems and techniques. More particularly, embodiments of the present invention relate to hyperpolarized MRI and NMR. Merely by way of example, the present invention has been applied to a method of partially transferring nuclear spin polarization from one site to another site by way of heteronuclear spin coupling. The methods and systems can be applied to a variety of chemical analysis and medical imaging applications.

According to an embodiment of the present invention, a method of measuring precessing magnetization is provided. The method includes providing a first site characterized by a first spin order and providing a second site. The method also includes transferring a portion of the first spin order from the first site to the second site. The second site is characterized by a second spin order orthogonal to the first spin order. The method further includes exposing a sample including the first site and the second site to a magnetic field, measuring a precessing magnetization of at least one of the first site or the second site, repeating the transferring a portion of the first spin order from the first site to the second site, and repeating the measuring of the precessing magnetization.

According to another embodiment of the present invention, a method of performing indirect detection of a first site by transferring polarization from the first site to a second site for multiple measurements of the first site is provided. The method includes determining a scalar coupling coefficient for the polarization transfer from the first site to the second site. The first site is characterized by a first polarization. The method also includes defining a set of polarization division parameters, computing timing and phase parameters using the set of polarization division parameters, providing a pulse sequence based on the timing and phase parameters, and exposing a sample including the first site and the second site to the pulse sequence. The method further includes transferring a portion of the first polarization to a second polarization, measuring a precessing magnetization of the second site, determining a state of the first site, and repeating transferring and measuring for subsequent portions of the first polarization.

According to an alternative embodiment of the present invention, a method of performing magnetic resonance is provided. The method includes providing a first site having a spin order of a first type and transferring a portion of the spin order of the first type to a second site. The second site has a spin order of a second type orthogonal to the spin order of the first type. The method also includes observing the spin order of the second type and repeating transferring and observing a predetermined number of times.

Embodiments of the present invention provide methods for the partial transfer of spin order between different types of spin order. A principal motivation for partial transfer is the desire to perform a time series of observations all of which derive from a common reservoir of spin order and each of which has a preselected proportionality to the initial amplitude of this first spin order. The partial transfer is ultimately to a second form of spin order, most usually spin polarization on some subset of the spins of a coupled spin system, which is observable by any method of NMR detection. The series of partial transfers ultimately depletes the first spin order while the second form of spin order is itself depleted by dephasing and other relaxation processes in the course of the observations. The information content of a series of proportional measurements is enhanced relative to the single measurement that would be the only one possible if the transfer were complete, rather than partial. In some implementations, each of the signals resulting from a series of partial transfers is smaller than the one signal possible with a complete transfer. Nevertheless, the novel strategy of partial transfers has advantages over hypothetical alternative strategies in which the first form of spin order is refreshed in order to make possible a series of complete transfers and measurements. These advantages stem primarily from the fact that refreshing the first form of spin order is time consuming, typically minutes to hours in the case of large nonequilibrium degrees of spin order, thus introducing an undesirable delay between measurement, during which delay other variables, such as subject physiology, may change in an uncontrolled fashion. Thus, the series of partial transfers and observations, typically complete on the time scale of tens of seconds, is a preferred strategy despite the reduction in individual signal amplitudes.

Embodiments of the present invention minimize this reduction in each signal by introducing a pulse sequence design that is globally efficient over the series of partial transfers and observations.

Embodiments of the present invention provide a method by which a specific fraction of polarization may be transferred from a heteronucleus to coupled equivalent protons for more sensitive detection while the majority of the polarization is placed back on the heteronucleus for later utilization. The methods and systems described herein enable high sensitivity ratiometric single scan dynamics for molecules in diverse and complex reaction environments, including in vivo.

According to a specific embodiment of the present invention, a method of magnetic resonance is provided in which an initial spin order of a first type is transferred to a spin order of a second orthogonal type in a time series of partial transfers, each of which is followed by observation of the resulting spin order prior to the next partial transfer and observation. Embodiments of the present invention utilize partial transfers that are efficient in the sense that the resulting spin density operator of the combined system of spins contains a predominance of the spin orders of the first and second type and a minimum of additional unwanted types of spin order. As an example, the spin order of the first type can be the nuclear spin polarization of one isotope and the spin order of the second type can be the nuclear spin polarization of a different isotope or of the same isotope spectrally resolved by the difference in chemical shift between magnetically inequivalent sites within a molecule.

In some embodiments, the transfer of spin order is effected by a predetermined sequence of electromagnetic pulses resonant with the Larmor frequencies of the inequivalent nuclei over a time period comparable to the inverse of the spin-spin coupling between the inequivalent nuclei. Additionally, each observation of the resulting spin order can be interspersed with or coincident with the application of magnetic field gradients so as to encode spatial information in the manner of magnetic resonance imaging. Alternatively, each observation of the resulting spin order can take place over a time period in which inequivalent spin evolution at different molecular sites allows the discrimination of the spin order associated with these sites in the manner of magnetic resonance spectroscopy.

In particular embodiment, the molecules containing the spin system are undergoing motion, binding, chemical transformation, and/or spin relaxation, the dynamics of any or all of which are followed by the combined analysis of the time series of observations subsequent to the partial transfers of spin order, in concert with the identification of molecular location and/or molecular identity obtained from the analysis of each spectroscopic and/or imaging observation in the time series.

In an embodiment, a method is provided in which Zeeman polarization, stored on a long lived nucleus, typically with lifetime of 10s to 100s of seconds, is partly transferred into polarization on one or more nuclei of a more sensitive isotope for the purposes of NMR or MRI detection while a remaining untransferred portion of the polarization is recovered as Zeeman polarization on the original long lived nucleus for subsequent partial or full transfers. Repeating this process multiple times enables a single population to be probed multiple times.

Numerous benefits are achieved by way of the present invention over conventional techniques. For example, embodiments of the present invention allow more sensitive detection of polarization for samples in which a time series of measurements is desired, an advantage over present techniques requiring direct detection. The methods described herein are applicable to both homogeneous and heterogeneous samples, an advantage over techniques that divide the sample that are only applicable to homogeneous experiments. Embodiments of the present invention allow multiple detections of the state of the low sensitivity nucleus, an advantage over techniques that completely transfer polarization in one step. Thus, the invention encompasses a broad novel class of fast multidimensional NMR experiments in which, for each instance of refreshing the first spin order, multiple distinct samples of the spin evolution before partial transfer of order are correlated with the spin evolution after the partial transfer. These and other embodiments of the invention, along with many of its advantages and features, are described in more detail in conjunction with the text below and attached figures.

DETAILED DESCRIPTION OF SPECIFIC EMBODIMENTS

Figure 1:
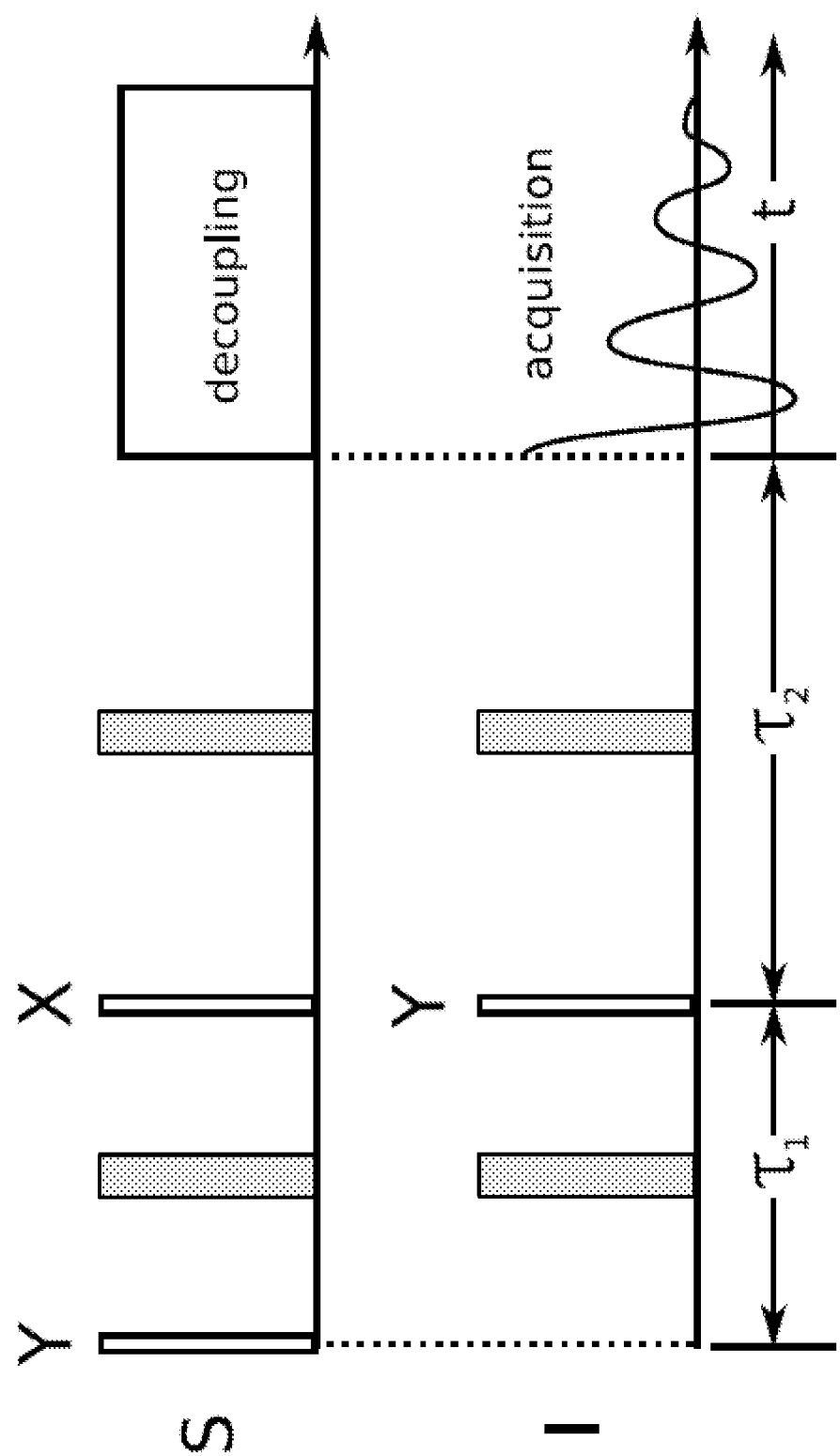
FIG. 1 illustrates a pulse sequence for transferring polarization using a refocused INEPT process.

Embodiments of the present invention relate to chemical analysis and medical imaging systems and techniques. More particularly, embodiments of the present invention relate to hyperpolarized MRI and NMR. Merely by way of example, the present invention has been applied to a method of partially transferring nuclear spin polarization from one site to another site by way of heteronuclear spin coupling. The methods and systems can be applied to a variety of chemical analysis and medical imaging applications.

According to an embodiment of the present invention, methods and systems are provided to partially transfer nuclear spin polarization from one isotope S to another isotope I by way of heteronuclear spin couplings, while minimizing the loss of spin order to other degrees of freedom. The desired I spin polarization to be detected is a design parameter, while the sequence of pulses at the two Larmor frequencies is optimized to store the greatest unused S spin longitudinal polarization for subsequent use. The unitary evolution for the case of $I_NS$ spin systems demonstrates the high (e.g., potentially ideal) efficiency provided by embodiments of the present invention, which is of particular interest when the spin-lattice relaxation time of S greatly exceeds that of I. Explicit timing and pulses have been tabulated for the cases for which M≤10 partial transfers each result in equal final polarization of 1/M or more compared to the final I polarization expected in a single transfer for N=1, 2, or 3 I spins. As described herein, embodiments of the present invention provide advantages for the ratiometric study of reacting molecules and hyperpolarized initial conditions.

In NMR and MRI of hyperpolarized systems, it is typical to use a series of small angle pulses, rather than a single π/2 pulse, in order to obtain signal transients at multiple time points over a total duration limited by spin-lattice relaxation of the initial polarization. Within this constraint, signals may be elicited at intervals chosen to optimize time resolution, sensitivity to changing concentrations, or synchronization with other phenomena such as physiological cycles. Importantly, multiple sampling at successive times allows ratiometric comparisons free of the relatively large amplitude fluctuations associated with the imperfect reproducibility of nonequilibrium polarization processes, the molecular delivery, and the state of the (living) target system.

Hyperpolarized signals are typically generated on insensitive spin ½ heteronuclei such as $^{13}C$ or $^{15}N$, which are preferred for their longer relaxation times and often superior chemical specificity. Longer relaxation time allows time to transfer the highly polarized molecules from the polarizer to the system of interest and to allow time for chemical dynamics with minimum polarization loss. Nuclei with lower gyromagnetic ratios tend to have longer spin-lattice relaxation times, so the most desirable targets from the point of view of long spin lifetimes are also the least desirable from the point of view of sensitivity. The gyromagnetic ratio enters linearly in both the magnitude of the detected magnetic moment and through the proportionality of inductive signals to Larmor frequency, offsetting the gains from hyperpolarization in comparison to detection on more sensitive nuclei.

Transferring the polarization to protons recovers this lost sensitivity and, for the purposes of MRI, additionally allows obtaining a given spatial resolution with practical pulsed field gradient power. When N equivalent protons I couple to the heteronucleus S, this transfer is efficiently produced by the refocused INEPT (insensitive nucleus enhanced by polarization transfer) sequence in the "reverse" direction. FIG. 1 illustrates a pulse sequence for transferring polarization using a refocused INEPT process. The dotted rectangles represent π pulses and the clear rectangles represent π/2 pulses in the sequence. This strategy can be used in conjunction with hyperpolarized samples in which the pulse sequence is designed to optimally polarize the target protons at the expense of fully depleting the heteronuclear hyperpolarization in the interrogated ensemble of molecules. This restricts the time series on such an ensemble to a single measurement of the state of the S spins with the possibility of observing that derived spin order on the I spins with multiple small angle I pulses within a time comparable to the much shorter proton relaxation time. In the special case of a system with uniform chemical composition (e.g. a solution in a NMR tube), a longer time course may be generated by spatially selecting different voxels for probing a reaction with complete S to I transfer at different times. In contrast, embodiments of the present invention enable multiple observations over a longer time course for each voxel resolved by MRI methods during each signal acquisition period.

A desirable feature for more effective use of the polarization available in a single pool of hyperpolarized molecules is a process that allows partial transfer to protons while preserving most of the spin order on the original heteronucleus in any ensemble of interrogated spins. This allows for a greater range of experiments, for instance acquiring multiple time points for MRI of chemical dynamics in a spatially nonuniform system. This can be achieved, for example, by detecting a fraction of the chemically exchanging polarization on sensitive protons I of product formed or precursor depleted, while continuing to accumulate reaction product under the protection of the slower S spin-lattice relaxation rate.

Embodiments of the present invention provide a method in which a hyperpolarized insensitive nucleus delivers enhancement repeatedly (HINDER). In FIG. 1, dotted rectangles represent $\pi$ pulses and clear rectangles represent $\pi/2$ pulses in the sequence. Referring to FIG. 1, the two $\pi/2$ pulses on S must have a 90° phase offset in order to fully transfer polarization to I. A 0° relative phase would lead to scrambling of the existing polarization into unwanted operators. However, the inventors have determined that when $\tau_1$ is shortened from the value prescribed by INEPT, this second $\pi/2$ pulse serves to return some polarization to the z-axis when the relative phase is 0°. With this degree of freedom, it is possible to divide the spin order between the two useful paths, becoming final I or S polarization, using the phase of a single pulse. These paths can be simultaneously optimized, by choosing a relative phase of the two S pulses between 0° and 90° and, in a correlated manner, tuning $\tau_1$ for a given system to minimize unwanted operators.

Figure 2A:
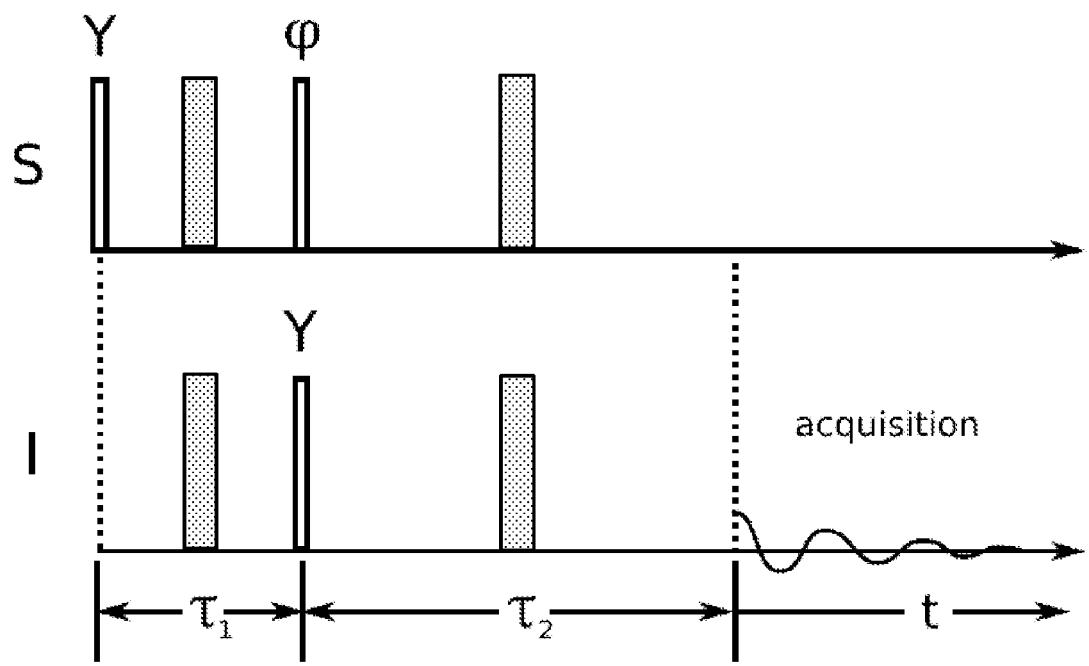
FIG. 2A illustrates a pulse sequence according to an embodiment of the present invention.
Figure 2B:
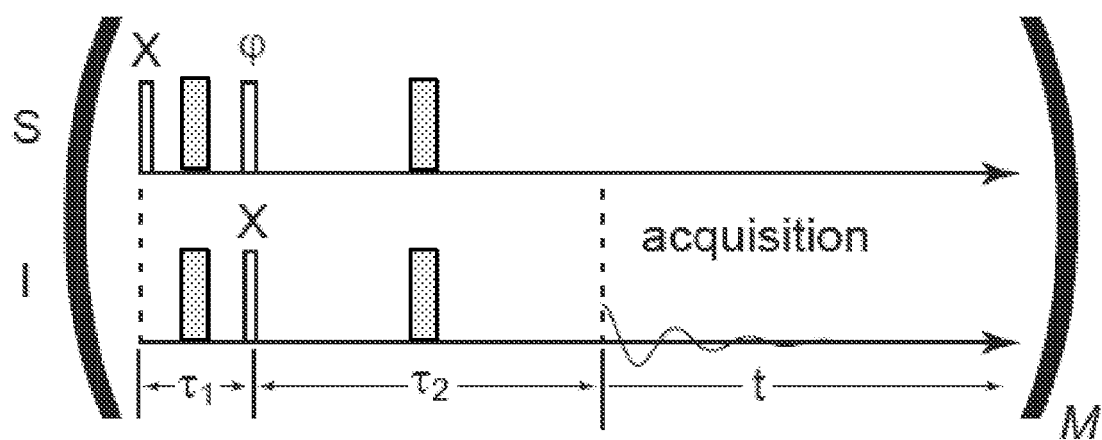
FIG. 2B illustrates application of the HINDER sequence for M transfers according to an embodiment of the present invention.

FIG. 2A illustrates a pulse sequence according to an embodiment of the present invention. The pulse sequence illustrated in FIG. 2A can be referred to as a HINDER sequence. Dotted rectangles represent $\pi$ pulses and clear rectangles represent $\pi/2$ pulses in the sequence. The first evolution period $\tau_1$ and relative phase of the second $\pi/2$ pulse on S in HINDER are optimized to yield the desired amount of polarization on I for detection while leaving the maximum on S for subsequent experiments. FIG. 2B illustrates application of the HINDER sequence for M transfers according to an embodiment of the present invention. As shown in FIG. 2B, the sequence is repeated with the updated optimum variables for each of M desired transfers and observations as I spin transients.

When this pulse sequence is used on an $I_N S$ spin system for a series of M transfers, the polarization left on S after the m th ($1 \leq m \leq M$) transfer $P_S^m$ is $$P_S^m(\tau_1) = P_S^{m-1} \cos^N(J_{IS}\tau_1/2)\cos\phi, \quad (1)$$

where $J_{IS}$ is the scalar coupling between S and I in radians per second. The total signal $NP_I^m$ available for detection on I after the m th transfer is $$NP_I^m(\tau_1,\tau_2) = P_S^{m-1} N \sin(J_{IS}\tau_1/2)\cos^{N-1}(J_{IS}\tau_1/2)\sin(J_{IS}\tau_2/2)\sin\phi. \quad (2)$$

This signal is optimized with respect to $\tau_2$ when $$\tau_2 = \pi/J_{IS} \quad (3)$$

giving the $m^{th}$ signal $$NP_I^m(\tau_1) = P_S^{m-1} N \sin(J_{IS}\tau_1/2)\cos^{N-1}(J_{IS}\tau_1/2)\sin\phi. \quad (4)$$

FIG. 2B illustrates application of the HINDER sequence for M transfers according to an embodiment of the present invention. As illustrated in FIG. 2B, the pulse sequence illustrated in FIG. 2A is repeated M times to accomplish M transfers. It should be noted that the timing (e.g., $\tau_1$) and phase (e.g., $\phi$) can vary from transfer to transfer. Thus, in some embodiments, notations such as superscripts can be utilized to represent the values of the timing and phase for each of the M transfers, such as $\tau_1^m$ and $\phi^m$. After the series of M transfers, the polarization is preferably completely transferred, producing a final transfer result similar to an ideal INEPT process.

Figure 2C:
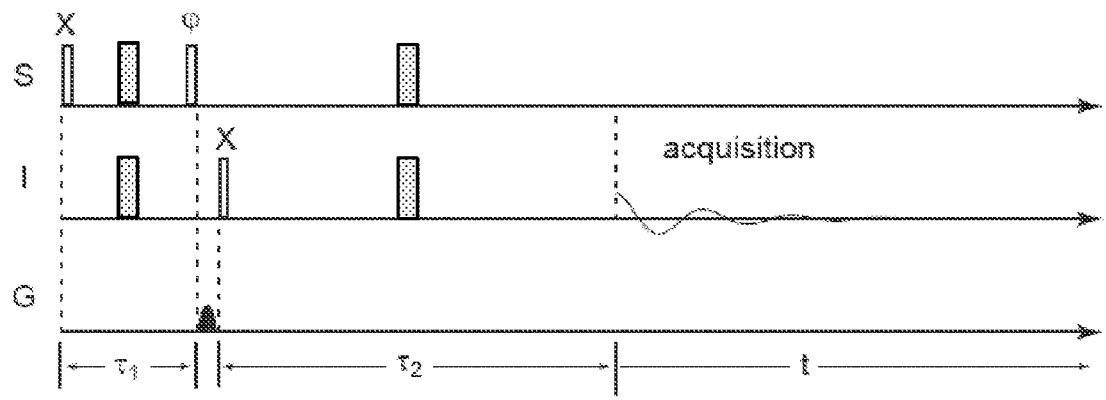
FIG. 2C illustrates a pulse sequence including a pulsed field gradient according to an embodiment of the present invention.

FIG. 2C illustrates a pulse sequence including a pulsed field gradient according to an embodiment of the present invention. As illustrated in FIG. 2C, the gradient is positioned after the third pulse on the first site and before the second pulse on the second site.

Figure 2D:
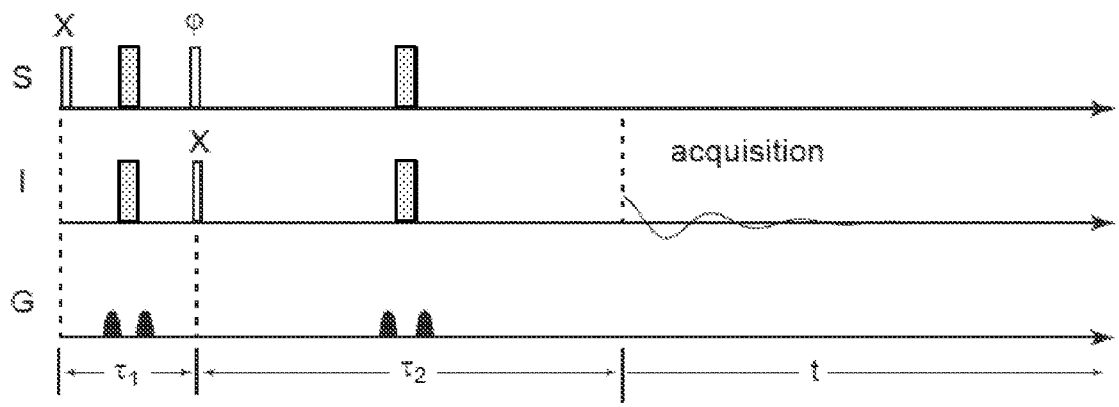
FIG. 2D illustrates a pulse sequence including multiple pulsed field gradients according to an embodiment of the present invention.

FIG. 2D illustrates a pulse sequence including multiple pulsed field gradients according to an embodiment of the present invention. Referring to FIG. 2D, in some embodiments, the first two gradients match and the second two match, but the first set does not need to match the second set. As shown in FIG. 2D, matching gradients are utilized before and after the simultaneous $\pi$ pulses. In some embodiments, the gradient techniques illustrated in FIGS. 2C and 2D can be combined. One of ordinary skill in the art would recognize many variations, modifications, and alternatives.

To choose the HINDER parameters, the fraction of $(1-P_S^m)/P_S^{m-1}$ to be transferred to I is specified according to Eq. (1), which then constrains the optimization of Eq. (4). Alternatively, the final I polarization given by Eq. (4) may be specified, constraining the optimization of Eq. (1). These points of view lead to the same optimum values of $\phi$ and $\tau_1$ and the results of such an optimization are shown in FIG. 3.

Figure 3:
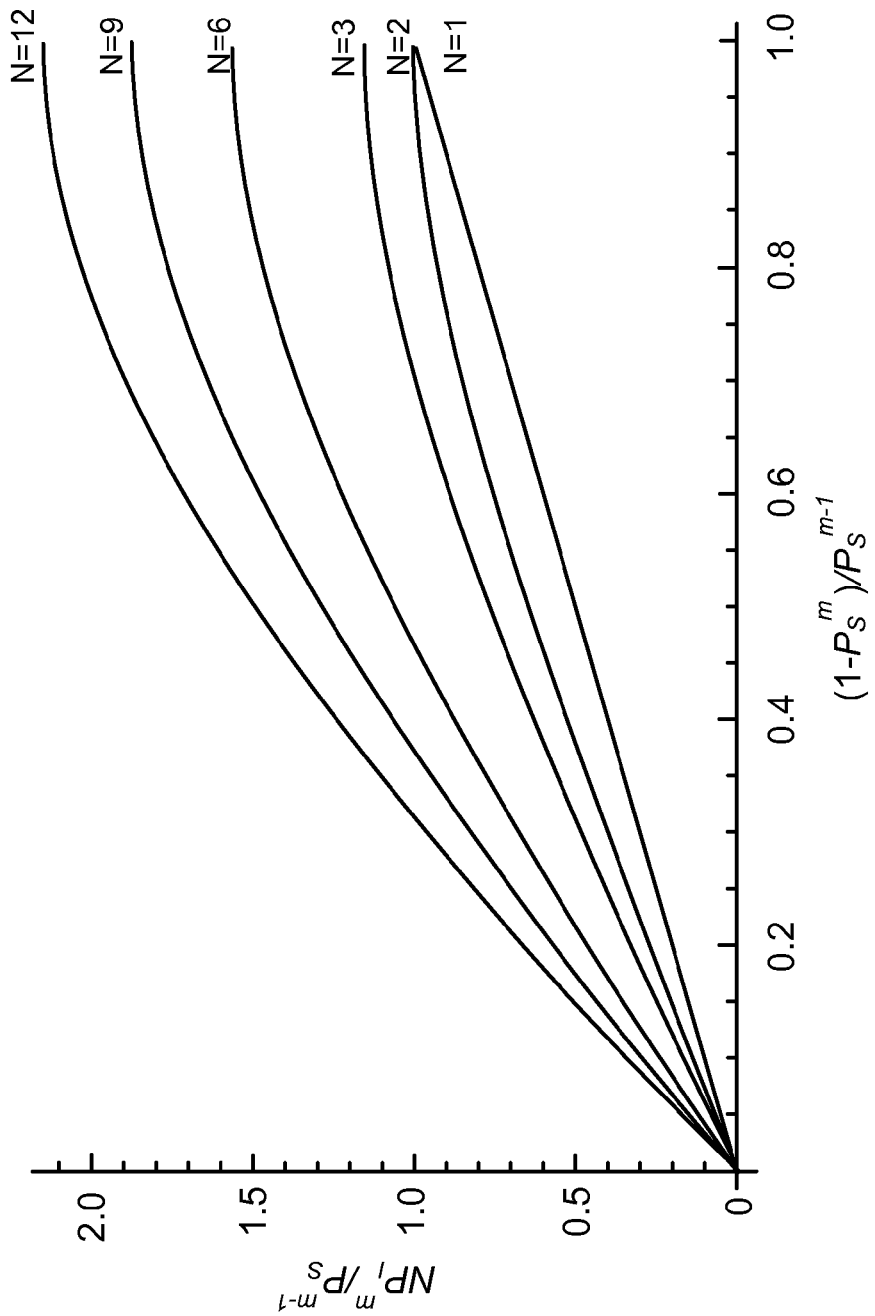
FIG. 3 illustrates the optimized spin order obtainable on N spins I as a function of the preselected fraction of S polarization used according to an embodiment of the present invention.

FIG. 3 illustrates the optimized spin order obtainable on N spins I as a function of the preselected fraction of S polarization used according to an embodiment of the present invention. The curves illustrated in FIG. 3 are for, from bottom to top, N=1, 2, 3, 6, 9, and 12.

The transfer efficiency $e_m = NP_I^m/(1-P_S^m)$ for each repetition varies with the fraction of S polarization transferred for N>1, as seen from FIG. 3. It should be noted that the asymptotic value for small fractions $(1-P_S^m)$ is $e_m = \sqrt{N}$, exceeding the efficiency of optimized INEPT and leading to the interesting observation that the summation of the I spin signal over m can also exceed the signal from optimized INEPT. This does not violate constraints of unitary time evolution, since this treatment of the overall HINDER process assumes I spin relaxation after each transfer and is thus nonunitary. Embodiments of the present invention adjust the timing and phase parameters to reduce or minimize undesirable operators, providing high coupling efficiency.

Figure 4:
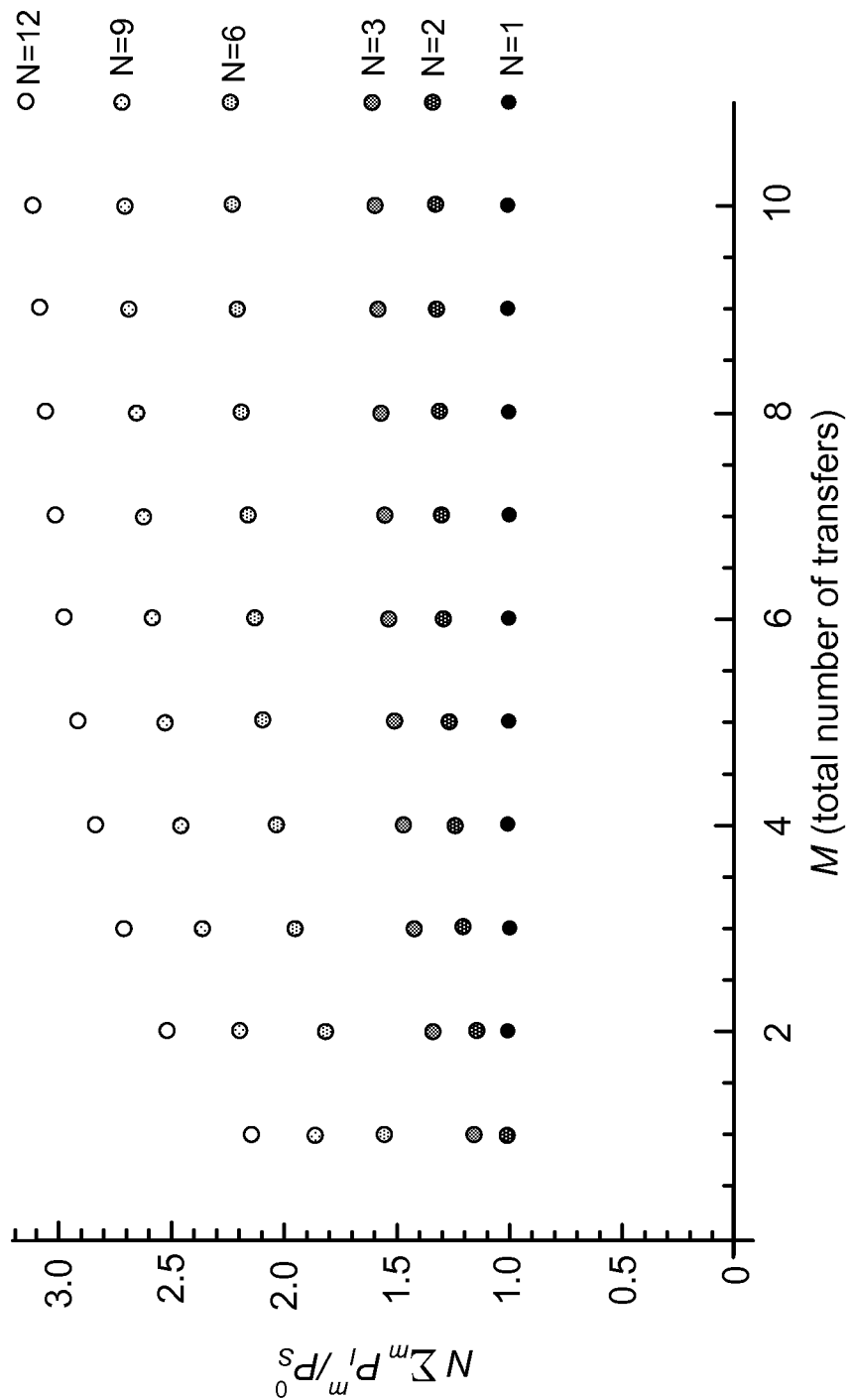
FIG. 4. illustrates the total signal delivered to N spins I when transferred in M equivalent partial transfers according to an embodiment of the present invention.
Figure 5A:
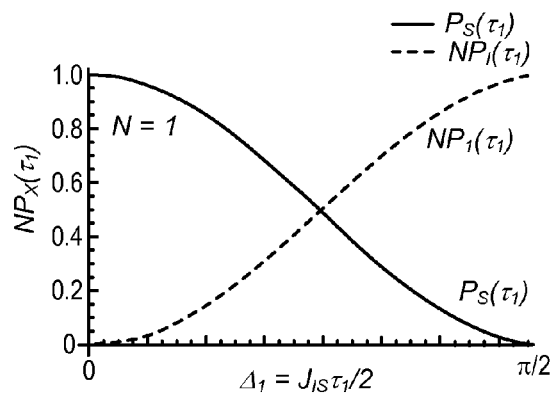
FIGS. 5A-5F are plots of $P_S(\tau_1)$ (solid lines) and $NP_I(\tau_1)$ (dashed lines) vs. pulse parameters according to an embodiment of the present invention.
Figure 5B:
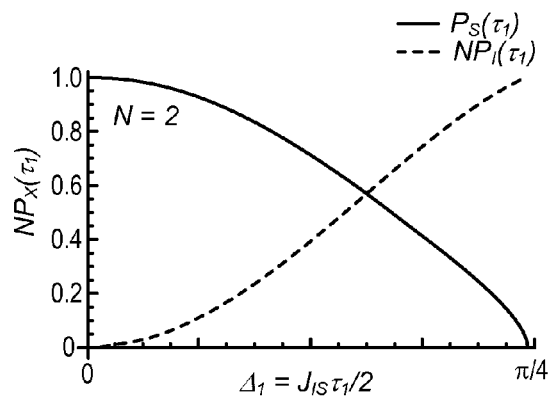
Figure 5C:
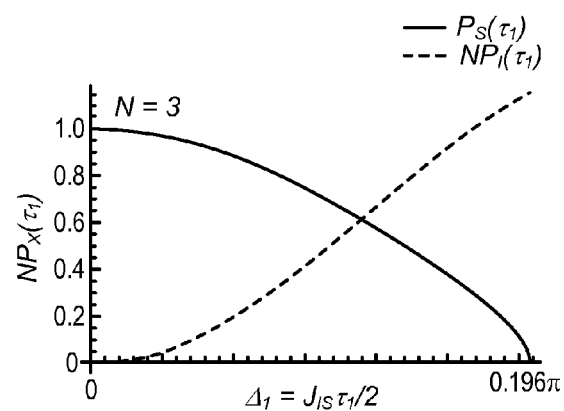
Figure 5D:
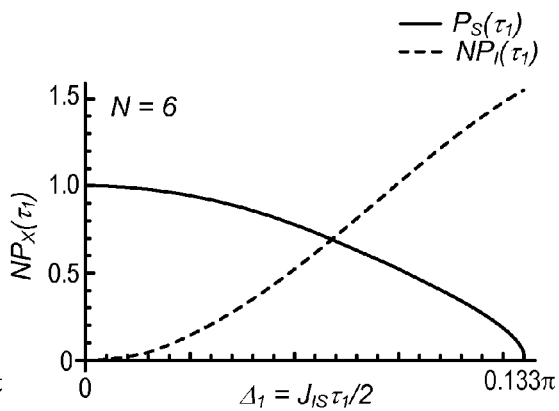
Figure 5E:
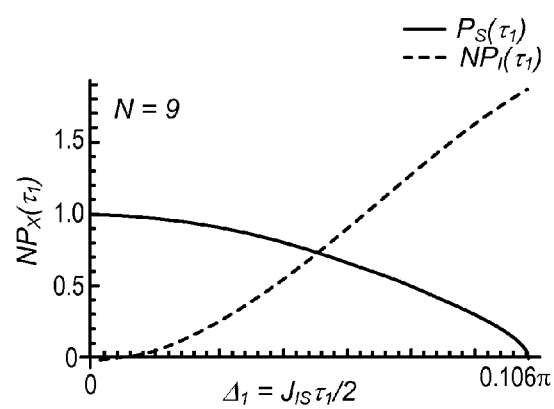
Figure 5F:
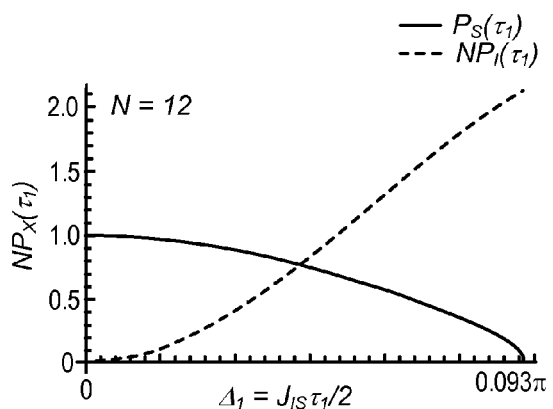

FIG. 4 illustrates the total signal delivered to N spins I when transferred in M equivalent partial transfers according to an embodiment of the present invention. In FIG. 4, N=1, 2, 3, 6, 9, 12 (bottom to top). The sum of signals is shown in FIG. 4 in the limit that both relaxation during the transfers and subsequent S spin-lattice relaxation are negligible, while all other spin order either decays or is destroyed between transfers. To the extent that other relaxation processes will affect the transfer, they can be accounted for in a fully optimized sequence, in a manner that has already been applied to INEPT [26].

Embodiments of the present invention utilize the sequence described herein, repeated multiple times, with an appropriate progression of parameters. As an example of the present invention, a sequence is provided for which (a) each partial transfer results in the same proton polarization and (b) the entire polarization initially available on S is eventually transferred to I for detection. The excess proton spin order on I, as well as any that is in the form of heteronuclear product operators, will be assumed to be fully dissipated by spin relaxation prior to the next HINDER transfer, an approximation that is accurate when the I spin relaxation times are much shorter than the S spin-lattice relaxation time. The fractional transfers may be determined by a recursive method starting with the final repetition m=M and working backward. This final step will preferably use all of the remaining polarization, so is equivalent to INEPT ($\phi$=90°). Each prior step is then determined in turn such that the polarization generated on I is equal to that found for the next step when scaled by the polarization left on S, i.e. $P_I^m = P_I^{m+1} P_S^m$. Parameters for such a sequence for some commonly occurring cases are displayed in Table 1. Since the desired signal originates on the heteronucleus, background signals can easily be reduced by presaturation of the protons prior to the HINDER sequence.

TABLE 1

|  | N = 1 | | N = 2 | | N = 3 | |
| --- | --- | --- | --- | --- | --- | --- |
| m | $\phi$ (°) | $J_{IS}\tau_1$ | $\phi$ (°) | $J_{IS}\tau_1$ | $\phi$ (°) | $J_{IS}\tau_1$ |
| M − 9 | 18.435 | 0.644 | 18.050 | 0.442 | 17.980 | 0.358 |
| M − 8 | 19.471 | 0.680 | 19.033 | 0.465 | 18.956 | 0.377 |
| M − 7 | 20.705 | 0.723 | 20.199 | 0.493 | 20.112 | 0.400 |
| M − 6 | 22.208 | 0.775 | 21.614 | 0.527 | 21.515 | 0.426 |
| M − 5 | 24.095 | 0.841 | 23.382 | 0.569 | 23.268 | 0.460 |
| M − 4 | 26.565 | 0.927 | 25.681 | 0.623 | 25.549 | 0.503 |
| M − 3 | 30 | 1.047 | 28.855 | 0.696 | 28.698 | 0.562 |
| M − 2 | 35.264 | 1.231 | 33.680 | 0.806 | 33.492 | 0.648 |
| M − 1 | 45 | 1.571 | 42.558 | 0.997 | 42.353 | 0.799 |
| M | 90 | 3.142 | 90 | 1.571 | 90 | 1.231 |

As shown in Table 1, values are determined for $\phi$ and $J_{IS}\tau_1$ that will yield a series of M≤10 partial transfers, starting at m=1 as determined by selecting M, and continuing to m=M. These transfers give equivalent final proton enhancement in the case that $T_1^{-1}$ on the heteronucleus is negligible and order besides $S_z$ decays or is destroyed prior to subsequent transfers.

FIGS. 5A-5F are plots of $P_S(\tau_1)$ (solid lines) and $NP_I(\tau_1)$ (dashed lines) vs. pulse parameters according to an embodiment of the present invention. As illustrated in FIGS. 5A-5F, the portion of the polarization transferred from the first site to the second site is illustrated as a function of the pulse parameters as well for various numbers of target sites I. In some embodiments, the pulse parameters are the optimal values of the timing and the phase to effect efficient transfer while minimizing additional unwanted types of spin order. An example would be bilinear operators that are unobservable. In the plots shown in FIGS. 5A-5F, $\Delta_2 = \pi/2$ and $P_S^0 = 100\%$. $\phi$ and $\Delta_1$ have been optimized to give some desired $P_S(\tau_1)$ remaining for further experiments. The optimization of the same quantities based on the $NP_I(\tau_1)$ desired for use gives identical plots.

The sequence timings are calculated for the scalar couplings of a specific grouping, so the method presented is most readily optimized in experiments in which the fate of a single molecular species over time is examined. This is the case in experiments where the hyperpolarized molecule provides contrast to highlight specific areas, such as vascular imaging. This is also the case when a specific molecule generated from the hyperpolarized molecule is of interest, as in the imaging of plaques where the bound molecule is the interesting species or in cases where the information of interest is the changing concentration or distribution of a particular metabolite. In cases of metabolite mapping where more than one of the daughter molecules of the hyperpolarized species is of interest, this technique will also work efficiently when the daughter molecules fortuitously require similar parameters for the polarization transfer. Otherwise, the relative concentrations of species as shown by the magnitude of the peaks will be distorted by the inequivalent polarization transfer within the differing molecules. However, this distortion is consistent and calculable. In these cases, the situation may be improved by similar adaptation of a variation of INEPT meant to be less dependent on the specific coupling constants in the molecule [27].

The strategy used in the construction of this sequence could be applied to other order transfer sequences, possibly also leading to improvements over conventional methods. The methods and systems described herein for an efficient partial polarization sequence, together with known (numerical and analytical) strategies for optimizing a pulse sequence for a particular final state, provide a design strategy enabling other such sequences. The starting point for such a design strategy could be other sequences for spin order transfer between groups of like or unlike spins.

The inventors have applied modifications applicable to INEPT to improve the sequence under certain circumstances as applicable to HINDER. One such improvement is the use of a refocus period [10] incorporated into the sequence, which may be further optimized taking relaxation into account [26]. Phase cycling may be used to suppress unwanted signal from equilibrium polarization. When phase cycling is undesirable, pulsed field gradients provide a good alternative for selecting specific magnetization for detection and destroying undesirable coherences. When there are additional, inequivalent protons, selective recoupling [24-25] will help direct the polarization to the intended protons. The chemical shift range of heteronuclei may require the application of more broadband inversion pulses [28].

There are potential applications for this partial transfer in non-hyperpolarized systems studied by NMR and MRI. A number of experiments prepare the spin order into a non-equilibrium state, allow some interesting dynamics to proceed, and finally convert that state to transverse magnetization for readout. The HINDER approach enables experiments in which long-lived Zeeman polarization, prepared once, is probed at multiple times. The posited long lifetime of the first polarization has as a corollary that it is only slowly refreshed to its equilibrium value. However, a single optimized transfer (e.g. INEPT) of (equilibrium) polarization from the more rapidly relaxing spins can provide an advantageous method of refreshing the first polarization, typically to a value even greater than its own equilibrium value. This would represent a time savings and improved time resolution over the conventional method when there is sufficient signal. Furthermore, it achieves signal-to-noise advantages associated with the ability to compare the ratio of successive measurements resulting from the same initial reservoir of spin order, regardless of whether that order results from an equilibrium or nonequilibrium process.

Figure 6:
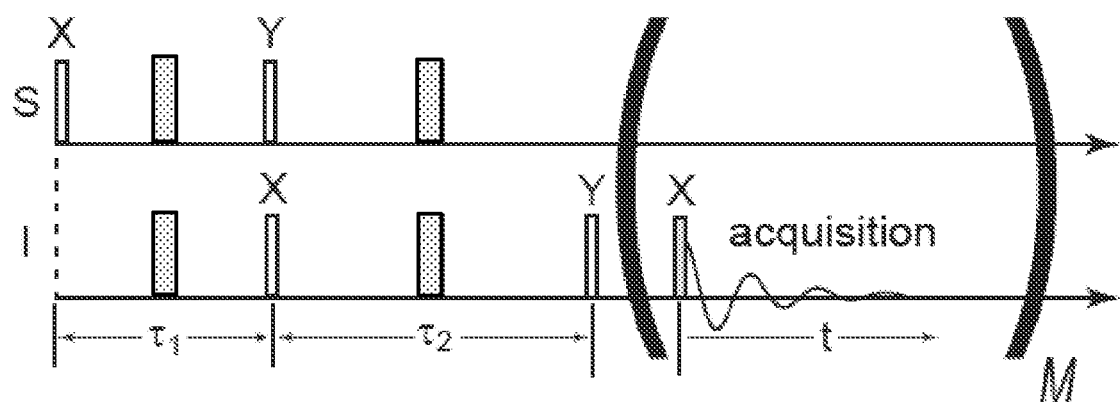
FIG. 6 illustrates a pulse sequence for a single polarization transfer and multiple measurement process according to an embodiment of the present invention.

FIG. 6 illustrates a pulse sequence for a single transfer and multiple measurement process according to an embodiment of the present invention. As illustrated in FIG. 6, INEPT could be used, storing the resulting polarization along z. Then, M small angle pulses could be used for detection. In these embodiments, benefits are provided that are not available using conventional techniques that transfer the polarization just once and make a single measurement. This embodiment is instructive in that the advantage of long storage time prior to the measurements is retained, but in contrast to HINDER, the time scale encompassed by the measurement sequence is typically limited by the typically faster relaxation of the observed spin.

Figure 7:
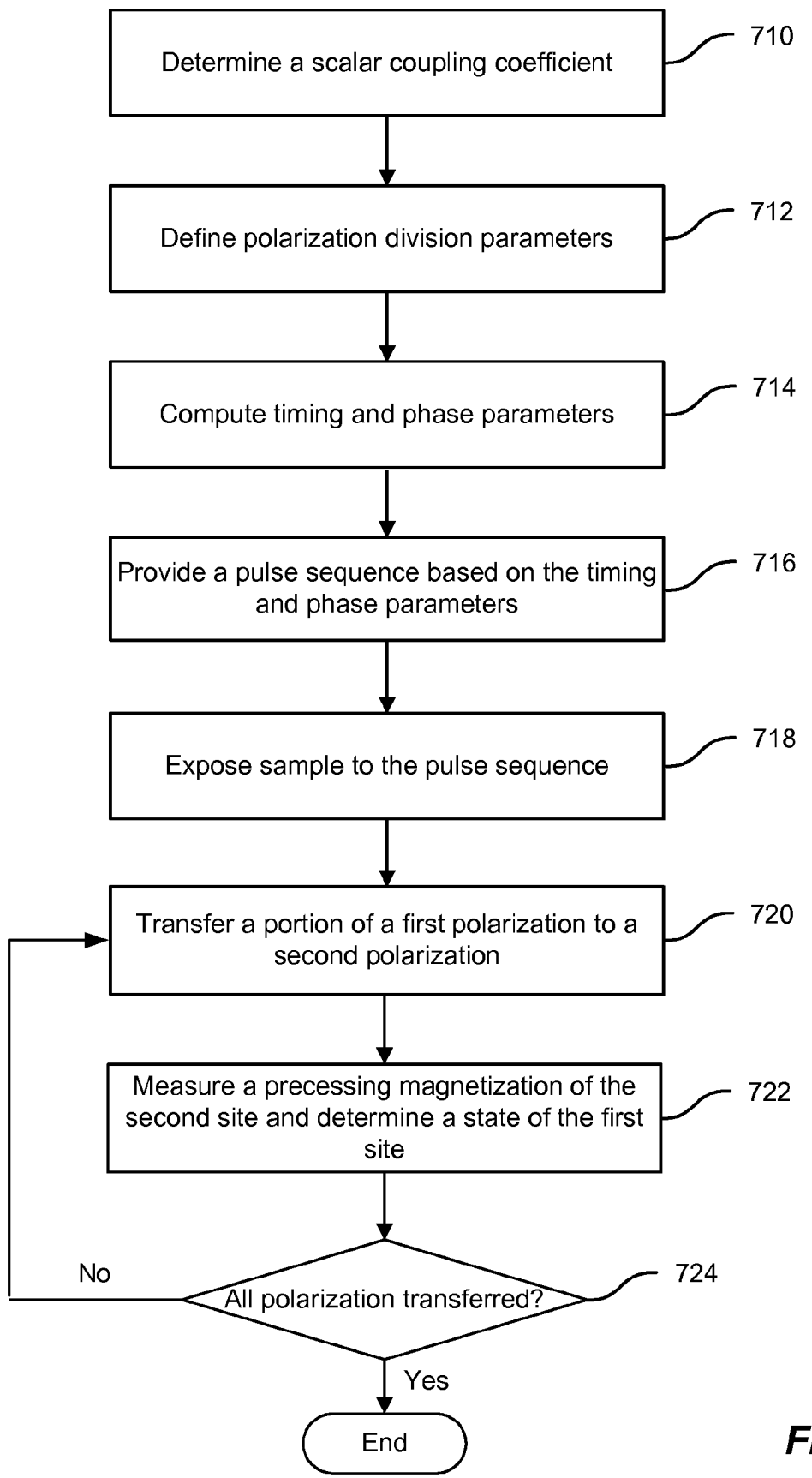
FIG. 7 is a simplified flowchart illustrating a method for indirect detection of a site by transferring polarization from that site to a second site for multiple measurements of the first site according to an embodiment of the present invention.

FIG. 7 is a simplified flowchart illustrating a method of performing indirect detection of an insensitive nucleus by transferring polarization from that nucleus to a second nucleus type for multiple measurements of that first nucleus according to an embodiment of the present invention. The method illustrated in FIG. 7 is of particular application to NMR and MRI systems. The method includes determining the relevant scalar coupling (e.g., J-coupling) of the species of interest (710). In the example below, a nucleus having a polarization is used as an example, but the present invention is not limited to Zeeman polarization and other types of spin order can be utilized as appropriate to the particular application. One of ordinary skill in the art would recognize many variations, modifications, and alternatives.

The method also includes defining the polarization division parameters (e.g., the desirable division of polarization for the predetermined number of transfer events) (712). The division of polarization will determine the polarization distribution available at the beginning of the signal acquisitions. Using either a lookup table or by optimizing equations, timing and phase parameters are computed (714). Referring to FIG. 2, the series of values used for $\tau_1$ and $\phi$ are computed. As examples, values of $\tau_1$ can range from about 1 ms to about 1,000 ms, for example 50 ms and values of $\phi$ can range from zero to $\pi/2$. In a particular implementation, $J_{IS}/2\pi$ is between 1 Hz and 15 Hz, with corresponding values for $\tau_1$ and $\phi$.

The method further includes providing a pulse sequence based on the timing and phase parameters (716). As an example, the pulse sequence can be programmed into a computer controlling an NMR or MRI instrument. In some implementations, programming of the instrument is performed automatically by other system components. A sample including the first nucleus and the second nucleus is placed in a measurement position and the sample is exposed to the pulse sequence (718). A portion of the first polarization associated with the first nucleus is transferred to a second polarization associated with the second nucleus (720) and a precessing magnetization of the second nucleus is measured and the chemical identity, location, or dynamics of the molecule containing the nuclei is determined (722). The method also includes repeating transferring and measuring for subsequent portions of the first polarization with the appropriate sequence parameters for each step until all the polarization is transferred (724).

It should be appreciated that the specific steps illustrated in FIG. 7 provide a particular method of performing indirect detection of an insensitive nucleus by transferring polarization from that nucleus to a second nucleus type for multiple measurements of the coupled spin system according to an embodiment of the present invention. Other sequences of steps may also be performed according to alternative embodiments. For example, alternative embodiments of the present invention may perform the steps outlined above in a different order. Moreover, the individual steps illustrated in FIG. 7 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 8:
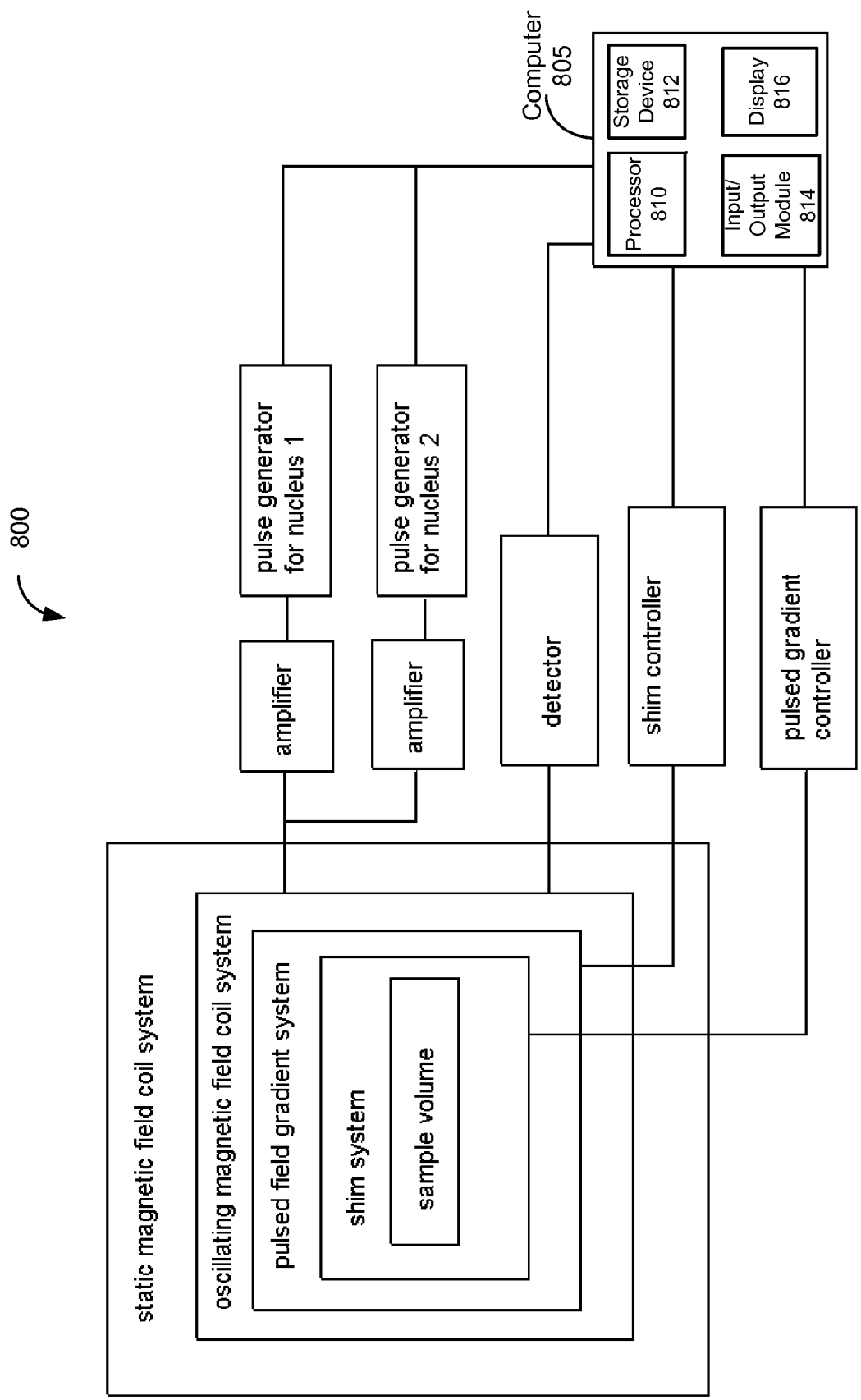
FIG. 8 is a simplified schematic diagram of a chemical analysis or imaging system according to an embodiment of the present invention.

FIG. 8 is a simplified schematic diagram of an imaging system or spectrometer according to an embodiment of the present invention. The instrument is applicable to MRI, NMR, and other appropriate systems. The system 800 includes a computer 805 including a processor 810, a storage device 812, an input/output module 814, and a display 816.

The imaging system 800 also includes a static magnetic field coil system, an oscillating magnetic field coil system, and pulsed field gradient system. The computer is operable to provide control signals to a pulse generator for a first nucleus and a pulse generator for a second nucleus, which are coupled to amplifiers as illustrated. A detector and a shim system coupled to a shim controller are also illustrated in FIG. 8. In some embodiments, a pulsed gradient controller is provided for use in pulsed gradient applications as discussed in relation to FIGS. 2C and 2D. The pulsed gradient system and the shim system may embody the same physical hardware. The sample volume is also illustrated in FIG. 8. It will be appreciated that the nesting order illustrated in FIG. 8 is not required and other configurations can be utilized as appropriate to the particular applications. As an example, gradients/shims are sometimes provided outside oscillating field coils. One of ordinary skill in the art would recognize many variations, modifications, and alternatives.

The processor 810 (also referred to as a data processor), represents a central processing unit of any type of architecture, such as a CISC (Complex Instruction Set Computing), RISC (Reduced Instruction Set Computing), VLIW (Very Long Instruction Word), or a hybrid architecture, although any appropriate processor may be used. The processor 810 executes instructions and includes that portion of the computer 805 that controls the operation of the entire computer. Although not depicted in FIG. 8, the processor 810 typically includes a control unit that organizes data and program storage in memory and transfers data and other information between the various parts of the computer 805. The processor 810 receives input data from the input/output module 814, which may be received over a network, and reads and stores code and data in the storage device 812 and presents data to the input/output device 814.

Although the computer 805 is shown to contain only a single processor 810, the disclosed embodiment applies equally to computers that may have multiple processors with some or all performing different functions in different ways.

The storage device 812 represents one or more mechanisms for storing data. For example, the storage device 812 may include read-only memory (ROM), random access memory (RAM), magnetic disk storage media, optical storage media, flash memory devices, and/or other machine-readable media. In other embodiments, any appropriate type of storage device may be used. Although only one storage device 812 is shown, multiple storage devices and multiple types of storage devices may be present. Further, although the computer 805 is drawn to contain the storage device 812, it may be distributed across other computers, for example on a server.

The storage device 812 includes a controller (not shown in FIG. 8) and data items. The controller includes instructions capable of being executed on the processor 810 to carry out the methods described more fully throughout the present specification. In another embodiment, some or all of the functions are carried out via hardware in lieu of a processor-based system. In one embodiment, the controller is a web browser, but in other embodiments the controller may be a database system, a file system, an electronic mail system, a media manager, an image manager, or may include any other functions capable of accessing data items. Of course, the storage device 812 may also contain additional software and data (not shown), which is not necessary to understand the invention.

The input/output module 814 is that part of the computer 805 that receives input from and displays output to the user.

The computer also includes a display 816 may be a liquid crystal display (LCD) well-known in the art of computer hardware. But, in other embodiments the display 816 may be replaced with a gas or plasma-based flat-panel display or a traditional cathode-ray tube (CRT) display. In still other embodiments, any appropriate display device may be used. Although only one display 816 is shown, in other embodiments any number of display devices of different types, or of the same type, may be present. In an embodiment, the input/output module 814 and display 816 provide user interface functionality.

Thus, embodiments of the present invention provide a non-transitory computer-readable storage medium comprising a plurality of computer-readable instructions tangibly embodied on the computer-readable storage medium, which, when executed by a data processor, perform the methods and techniques described herein.

It is also understood that the examples and embodiments described herein are for illustrative purposes only and that various modifications or changes in light thereof will be suggested to persons skilled in the art and are to be included within the spirit and purview of this application and scope of the appended claims.

[1] Ardenkjer-Larsen J H, Fridlund B, Gram A, Hansson G, Hansson L, Lerche M H, et al. Increase in signal-to-noise ratio of >10,000 times in liquid-state NMR. Proceedings of the National Academy of Sciences of the United States of America. 2003; 100:10158-63.

[2] Goldman M, Johannesson H. Conversion of a proton pair para order into C-13 polarization by rf irradiation, for use in MRI. Comptes Rendus Physique. 2005; 6:575-81.

[3] Bhattacharya P, Harris K, Lin A P, Mansson M, Norton V A, Perman W H, et al. Ultrafast three dimensional imaging of hyperpolarized 13C in vivo. Magnetic Resonance Materials in Physics Biology and Medicine. 2005; 18:245-56.

[4] Golman K, in't Zandt R, Thaning M. Real-time metabolic imaging. Proceedings of the National Academy of Sciences of the United States of America. 2006; 103:11270-5.

[5] Chekmenev E Y, Hovener J, Norton V A, Harris K, Batchelder L S, Bhattacharya P, et al. PASADENA hyperpolarization of succinic acid for MRI and NMR spectroscopy. Journal of the American Chemical Society. 2008; 130: 4212-3.

[6] Bowers C R, Weitekamp D P. Transformation of symmetrization order to nuclear spin magnetization by chemical reaction and nuclear magnetic resonance. Physical Review Letters. 1986; 57:2645-8.

[7] Bowers C R, Weitekamp D P. Parahydrogen and synthesis allow dramatically enhanced nuclear alignment. Journal of the American Chemical Society. 1987; 109:5541-2.

[8] Pravica M G, Weitekamp D P. Net NMR alignment by adiabatic transport of parahydrogen addition products to high magnetic field. Chemical Physics Letters. 1988; 145: 255-8.

[9] Duckett S B, Newell C L, Eisenberg R. More Than Inept– Parahydrogen and Inept+ Give Unprecedented Resonance Enhancement to C-13 by Direct H-1 Polarization Transfer. 1993; 115:1156-7.

[10] Morris G A, Freeman R. Enhancement of nuclear magnetic resonance signals by polarization transfer. Journal of the American Chemical Society. 1979; 101:760-2.

[11] Natterer J, Schedletzky O, Barkemeyer J, Bargon J, Glaser S J. Investigating catalytic processes with parahydrogen: Evolution of zero-quantum coherence in AA'X spin systems. 1998; 133:92-7.

[12] Goldman M, Johannesson H, Axelsson O, Karlsson M. Hyperpolarization of C-13 through order transfer from parahydrogen: A new contrast agent for MRI. Magnetic Resonance Imaging. 2005; 23:153-7.

[13] Goldman M, Johannesson H, Axelsson O, Karlsson M. Design and implementation of C-13 hyperpolarization from para-hydrogen, for new MRI contrast agents. Comptes Rendus Chimie. 2006; 9:357-63.

[14] Norton V A. Efficient generation of hyperpolarized molecules utilizing the scalar order of parahydrogen. Pasadena, Calif.: California Institute of Technology; 2010.

[15] Kadlecek S, Emami K, Ishii M, Rizi R. Optimal transfer of spin-order between a singlet nuclear pair and a heteronucleus. Journal of Magnetic Resonance. 2010; 205:9-13.

[16] Bowers C R, Jones D H, Kurur N D, Labinger J A, Pravica M G, Weitekamp D P. The symmetrization postulate and NMR of reacting systems. Advances in Magnetic Resonance. 1990; 14:269-91.

[17] Carravetta M, Levitt M H. Long-Lived Nuclear Spin States in High-Field Solution NMR. Journal of the American Chemical Society. 2004; 126:6228-9.

[18] Levitt M H, Carravetta M, Johannessen O G, Kockenberger W. NMR spectroscopy using spin states with long lifetimes. US 0063700 A1 2007.

[19] Pileio G. Relaxation theory of nuclear singlet states in two spin-½ systems. Progress in Nuclear Magnetic Resonance Spectroscopy. 2010; 56:217-31.

[20] Maudsley A A, Ernst R R. Indirect detection of magnetic resonance by heteronuclear two-dimensional spectroscopy. Chemical Physics Letters. 1977; 50:368-72.

[21] Burum D P, Ernst R R. Net polarization transfer via a J-ordered state for signal enhancement of low-sensitivity nuclei. Journal of Magnetic Resonance. 1980; 39:163-8.

[22] Chekmenev E Y, Norton V A, Weitekamp D P, Bhattacharya P. Hyperpolarized 1H NMR employing low gamma nucleus for spin polarization storage. Journal of the American Chemical Society. 2009; 131:3164-5.

[23] Sarkar R, Comment A, Vasos P R, Jannin S, Gruetter R, Bodenhausen G, et al. Proton NMR of 15N-choline metabolites enhanced by dynamic nuclear polarization. Journal of the American Chemical Society. 2009; 131: 16014-5.

[24] Pfeilsticker J A, Ollerenshaw J E, Norton V A, Weitekamp D P. A selective 15N-to-1H polarization transfer sequence for more sensitive detection of 15N-choline. Journal of Magnetic Resonance. 2010; 205:125-9.

[25] Harris T, Giraudeau P, Frydman L. Kinetics from indirectly detected hyperpolarized NMR spectroscopy by using spatially selective coherence transfers. Chemistry—A European Journal. 2011; 17:697-703.

[26] Khaneja N, Reiss T, Luy B, Glaser S J. Optimal control of spin dynamics in the presence of relaxation. Journal of Magnetic Resonance. 2003; 162:311-9.

[27] Wimperis S, Bodenhausen G. Heteronuclear Coherence Transfer Over a Range of Coupling-Constants—A Broad-Band-INEPT Experiment. Journal of Magnetic Resonance. 1986; 69:264-82.

[28] Mishkovsky M, Kupce E, Frydman L. Ultrafast-based projection-reconstruction three-dimensional nuclear magnetic resonance spectroscopy. Journal of Chemical Physics. 2007; 127.

No inference should be made that the references cited herein are prior art merely because they are cited herein and no representation is being made that a search has been conducted of all possible relevant references.

What is claimed is:

1. A method of measuring precessing magnetization with a magnetic resonance system in a single magnetic resonance scan sequence, the method comprising:

(a) providing, on a first site, a first nucleus having a first spin order;

(b) providing, on a second site, a second nucleus;

(c) exposing a sample including the first site and the second site to a magnetic field provided by the magnetic resonance system, wherein timing and phase parameters of the magnetic field are determined by a processor in order to achieve a desired transfer efficiency;

(d) transferring, as a result of exposing the sample to the magnetic field, a fractional portion of the first spin order of the first nucleus from the first site into a second spin order at the second nucleus on the second site, the transferring occurring at the desired transfer efficiency, and the second spin order being orthogonal to the first spin order;

(e) measuring a precessing magnetization of the first site or the second site using a magnetic detector, the measured precessing magnetization indicating either a retained portion of the first spin order or the transferred fractional portion of the first spin order;

(f) repeating (c)-(e) a predetermined number of times, with the desired transfer efficiency of each repetition being variable, in order to transfer additional fractional portions of the first spin order from the first site to the second site within the course of the single magnetic resonance scan sequence.

2. The method of claim 1 wherein the first spin order comprises at least one of a nuclear spin polarization or nuclear scalar order.

3. The method of claim 1 wherein the first nucleus on the first site and the second nucleus on the second site are different isotopes.

4. The method of claim 1 wherein measuring the precessing magnetization comprises performing at least one of spectroscopy or imaging using the magnetic resonance system.

5. The method of claim 1 wherein the first spin order comprises a Zeeman polarization.

6. The method of claim 5 wherein the Zeeman polarization is generated by a hyperpolarization process.

7. The method of claim 1 wherein the first a nucleus has a lifetime on an order of greater than or equal to 10 seconds.

8. The method of claim 7 wherein the first nucleus comprises at least one of $^{13}C$ or $^{15}N$.

9. The method of claim 1 wherein after transferring the fractional portion of the first spin order from the first site to the second site, an untransferred portion of the first spin order of nuclear spin is recovered with the magnetic resonance system as Zeeman polarization on the first site.

10. The method of claim 1 wherein the first spin order of nuclear spin comprises a scalar order.

11. A method of performing indirect detection of a nuclear spin polarization on a first site by transferring the nuclear spin polarization from the first site to a second site for multiple measurements in a single magnetic resonance transfer sequence, the method comprising:

(a) determining, with a processor, a scalar coupling coefficient for the polarization transfer from the first site to the second site, wherein the first site includes a first nucleus characterized by a first nuclear spin polarization, and wherein the second site includes a second nucleus;

(b) defining, with the processor, a set of polarization division parameters;

(c) computing timing and phase parameters of a magnetic pulse sequence, with the processor, in order to achieve a desired transfer efficiency using the set of defined polarization division parameters and the determined scalar coupling coefficient;

(d) providing, by a magnetic resonance system, the magnetic pulse sequence based on the timing and phase parameters;

(e) exposing a sample including the first site and the second site to the magnetic pulse sequence;

(f) transferring, as a result of the exposing the sample to the magnetic pulse sequence, a fractional portion of the first nuclear spin polarization from the first site into a second nuclear spin polarization on the second site, the transferring occurring at the desired transfer efficiency;

(g) measuring a precessing magnetization of the second site using a magnetic detector, the measured precessing magnetization indicating the transferred fractional portion of the first nuclear spin polarization;

(h) determining, from (g), a state of the first site; and (i) repeating (c)-(h) a predetermined number of times with the desired transfer efficiency of each repetition being variable, for additional fractional portions of the first nuclear spin polarization within the course of the single magnetic resonance transfer sequence.

12. The method of claim 11 wherein the first site comprises an isotope of a first element and the second site comprises $^1H$.

13. The method of claim 12 wherein the first element comprises at least one of $^{13}C$ or $^{15}N$.

14. The method of claim 11 wherein transferring the fractional portion of the first nuclear spin polarization to the second nuclear spin polarization preserves a remaining portion of the first nuclear spin polarization for subsequent transfers.

15. The method of claim 11 wherein providing the pulse sequence facilitates transferring portions of the first nuclear spin polarization.

16. The method of claim 11 wherein determining a state of the first site comprises determining a concentration of the first nucleus on the first site in a predetermined volume element utilizing the magnitude of the measured precessing magnetization.

17. A method of performing magnetic resonance with a single magnetic resonance scan sequence, the method comprising:

(a) providing, on a first site, a first nucleus having a spin order of a first type;

(b) transferring a fractional portion of the spin order of the first type to a second site with a desired transfer efficiency by exposing a sample including the first site and a second site to a magnetic field provided by a magnetic resonance system, wherein the second site includes a second nucleus having a spin order of a second type orthogonal to the spin order of the first type, and wherein timing and phase parameters of the magnetic field are determined by a processor in order to achieve the desired transfer efficiency;

(c) observing the spin order of the second type on the second site using a magnetic detector, the observed spin order of the second type indicating the transferred fractional portion of the spin order of the first type; and (d) repeating (b) and (c) a predetermined number of times, with the desired transfer efficiency of each repetition being variable, in order to transfer additional fractional portions of the spin order of the first type within the single magnetic resonance scan sequence.

18. The method of claim 17 wherein the spin order of the first type comprises a nuclear spin polarization.

19. The method of claim 17 wherein transferring the fractional portion of the spin order of the first type preserves a remaining portion of the spin order of the first type for subsequent transfers.

20. The method of claim 17 wherein after transferring a fractional portion of the spin order of the first type, a measurable spin density operator contains a predominance of the spin order of the first type as well as the spin order of the second type over other types of spin.

21. The method of claim 17 wherein the spin order of the first type comprises a nuclear spin polarization of one isotope and the spin order of the second type comprises a nuclear spin polarization of a different isotope.

22. The method of claim 17 wherein the spin order of the first type and the spin order of the second type comprise nuclear spin polarizations of an isotope that are spectrally resolvable by a difference in a chemical shift between magnetically inequivalent sites within a molecule.

23. The method of claim 17 wherein transferring the fractional portion of the spin order of the first type to the second site comprises generating, by the magnetic resonance system, a predetermined sequence of electromagnetic pulses resonant with Larmor frequencies of inequivalent nuclei over a time period comparable to the inverse of a spin-spin coupling occurring between the inequivalent nuclei.

24. The method of claim 17 further comprising applying, within the magnetic resonance system, one or more magnetic field gradients to the sample, wherein observing the spin order of the second type is either interspersed with or coincident with applying the one or more magnetic field gradients within the magnetic resonance system.

25. The method of claim 17 wherein observing the spin order of the second type takes place over a time period in which inequivalent spin evolution at different molecular sites allows discrimination of the spin order associated with the different molecular sites.

26. The method of claim 1 wherein the fractional portion of the first spin order transferred from the first site to the second site is controllable by a time period or a relative phase between two magnetic field pulses generated by the magnetic resonance system during the transferring.

* * * * *